United States Patent [19]
Anand

[11] Patent Number: 6,044,432
[45] Date of Patent: Mar. 28, 2000

[54] METHOD AND SYSTEM FOR LATCHING AN ADDRESS FOR ACCESSING SYNCHRONOUS RANDOM ACCESS MEMORY USING A SINGLE ADDRESS STATUS SIGNAL CONTROL LINE

[75] Inventor: Vishal Anand, Fremont, Calif.

[73] Assignee: VLSI Technology, Inc., San Jose, Calif.

[21] Appl. No.: 08/968,555

[22] Filed: Nov. 12, 1997

[51] Int. Cl.[7] .......................... G06F 12/00; G11C 11/413
[52] U.S. Cl. ............................. 711/104; 711/3; 711/167; 365/230.08
[58] Field of Search ............................. 711/3, 104, 105, 711/167, 200, 217, 218; 365/230.08, 233

[56] References Cited

U.S. PATENT DOCUMENTS

| | | | |
|---|---|---|---|
| 5,497,355 | 3/1996 | Mills et al. | 365/230.08 |
| 5,604,884 | 2/1997 | Thome et al. | 711/167 |
| 5,634,030 | 5/1997 | Nakano | 711/213 |
| 5,801,996 | 9/1998 | Seyyedy et al. | 365/189.05 |

*Primary Examiner*—Glenn Gossage
*Attorney, Agent, or Firm*—Wagner, Murabito & Hao LLP

[57] ABSTRACT

A method and system for latching an address for accessing a synchronous static random access memory (SRAM). A first address status signal of the SRAM is driven active, triggering an SRAM to latch the address on an address bus coupled therewith. A second address status signal is received when a valid address is placed on the address bus. In response, the first address status signal is driven inactive. This forces the last address latched by the SRAM to be the one indicated by the second address status signal. Then, a determination is made as to whether SRAM access is required based on the address placed on the bus. SRAM access may not be required if the current cycle is either non-cacheable or a miss in the SRAM. When SRAM access is not required, the first address status signal is driven active. In the alternative, when SRAM access is required, the first address status signal is maintained inactive. The first address status signal is maintained inactive until the SRAM is ready to accept a second address.

16 Claims, 6 Drawing Sheets

METHOD AND SYSTEM FOR LATCHING AN ADDRESS FOR ACCESSING SYNCHRONOUS RANDOM ACCESS MEMORY USING A SINGLE ADDRESS STATUS SIGNAL CONTROL LINE

TECHNICAL FIELD

The present claimed invention relates to the field of cache controllers. More particularly, the present claimed invention relates to synchronous static random access memory cache controllers.

BACKGROUND ART

Computers from the earliest times have generally performed better with more and faster random access memory (RAM). Indeed, an ideal computer would have an unlimited amount of fast RAM. In reality however, RAM has been one of the more expensive components in a computer system. The cost of a computer system escalates with the amount and speed of the RAM.

An economical solution, which most computer systems typically implement, is a memory hierarchy scheme. The memory hierarchy scheme is based on the principle that programs tend to reference a relatively confined area of memory repeatedly within a given period of time. This principle of locality encompasses two types of locality: spatial locality and temporal locality. Spatial locality refers to accessing addresses in the neighborhood of a once referenced address. On the other hand, temporal locality refers to accessing the once referenced address repeatedly.

The caching scheme implements the memory hierarchy scheme in the vast majority of computer systems today. The caching scheme utilizes a fast and small memory in combination with a slow and large memory. In general, the slow and large memory (e.g., main memory) implements dynamic RAM (DRAM) technology while the fast and small memory uses synchronous static RAM (SRAM) technology. The faster and smaller memory is often called the cache memory. Using the principle of locality, the caching scheme operates by loading data into the fast cache memory infrequently and accessing the loaded data many times before replacing the data with a new set of data. Caching schemes for loading and replacing data are well known in the art.

In general, the SRAM is typically implemented in an integrated circuit (IC) chip. The SRAM contains the actual memory cell array and circuits for synchronously accessing the data in the array. In order to load or access data in the array however, the SRAM must be provided with an address to the data to be loaded or accessed. In addition, the SRAM must be provided with control signals to latch the address synchronously at a precise time.

Conventional synchronous SRAM chips typically require three control signals to latch the address of a new clock cycle. For example, the SRAM, IDT71V433, manufactured by Integrated Device Technology, Inc. is a 3.3V high speed 1,048,576-bit SRAM organized as 32K×32 bit memory array including a full support of various processor interfaces to processors such as the Pentium™ (from Intel Corporation) and PowerPC™. The IDT71V433 requires three control signals: ADSP__, ADSC__, and CE__.

Figure 1A:
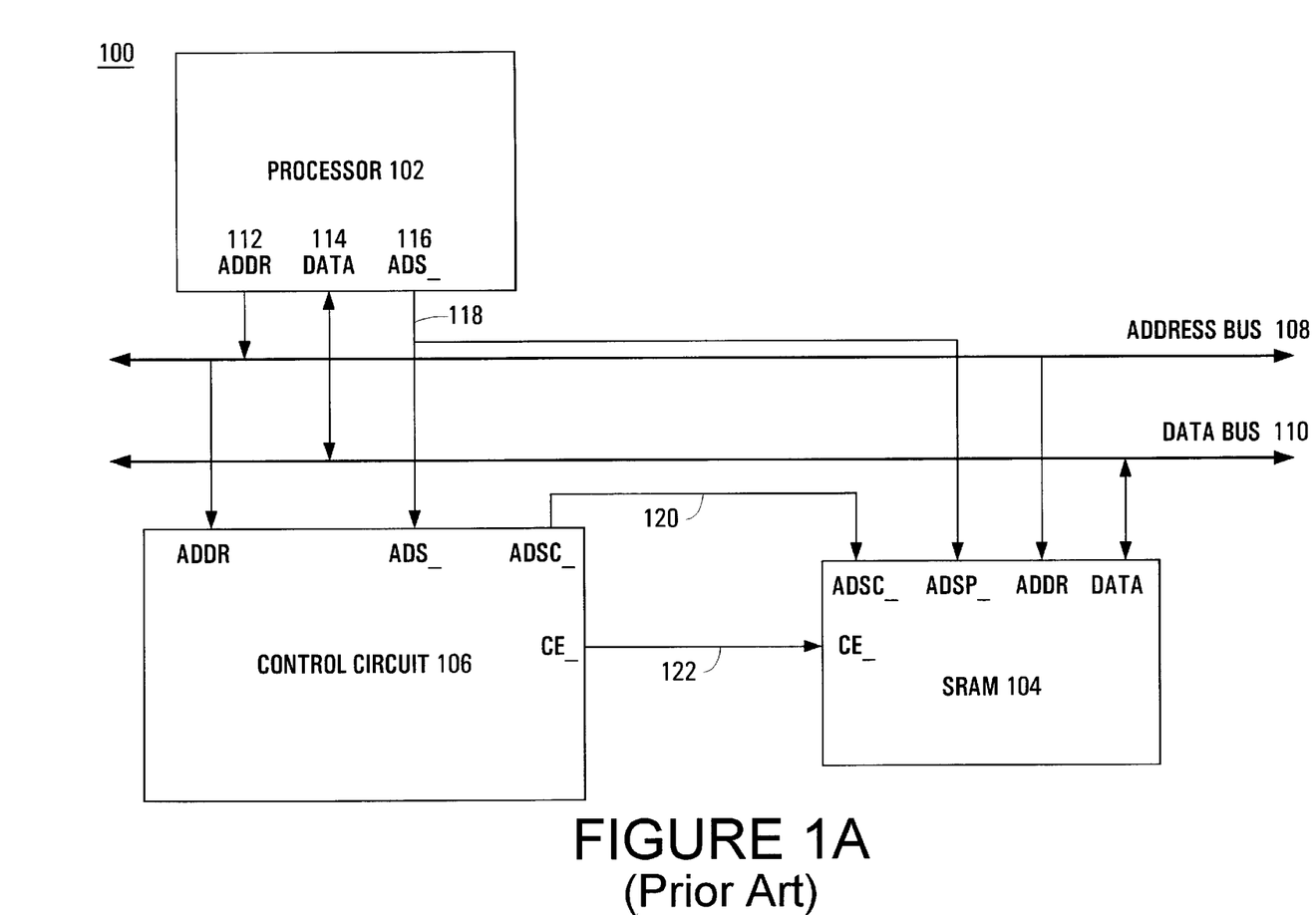
FIG. 1A illustrates a block diagram of a prior art cache system illustrating how an SRAM latches an address using three control signals.

Prior Art FIG. 1A illustrates a block diagram of a caching system 100 illustrating how a SRAM 104 latches an address using three control signals. A processor 102 issues an address 112 of a data 114 to be accessed and activates an address status signal ADS__. The address 112, data 114, and address status signal ADS__ 116 are put on address bus 108, data bus 110, and control bus line 118, respectively, for transmission. A controller, or control circuit 106 receives the address 112 and address status signal 116 on line 118.

The controller 106 generates an address status signal ADSC__ and transmits it to SRAM 104 over control bus line 120. The controller circuit 106 also generates a chip enable signal CE__ for enabling the SRAM 104. The chip enable signal CE__ is transmitted to SRAM 104 over control bus line 122.

The SRAM is coupled to the address bus 108 to receive an address to be latched. The data bus 110 is coupled to the SRAM to transmit data to and from the SRAM. The SRAM 104 receives three control signals for latching an address of a new clock cycle: the address status signal ADSP__, the address status signal ADSC__, and the chip enable signal CE__. The processor 102 generates and provides the address status signal ADSP__. On the other hand, the controller 106 generates and provides the address status signal ADSC__ and chip enable signal CE__. The controller 106 typically generates the address status signal ADSC__ for accessing the main memory 208 for load/store operations. In this configuration, the SRAM 104 latches a new address when the chip enable signal is active and either of the address status signals ADSC__ or ADSP__ are active. The latching of the new address is synchronized to a system clock.

Figure 1B:
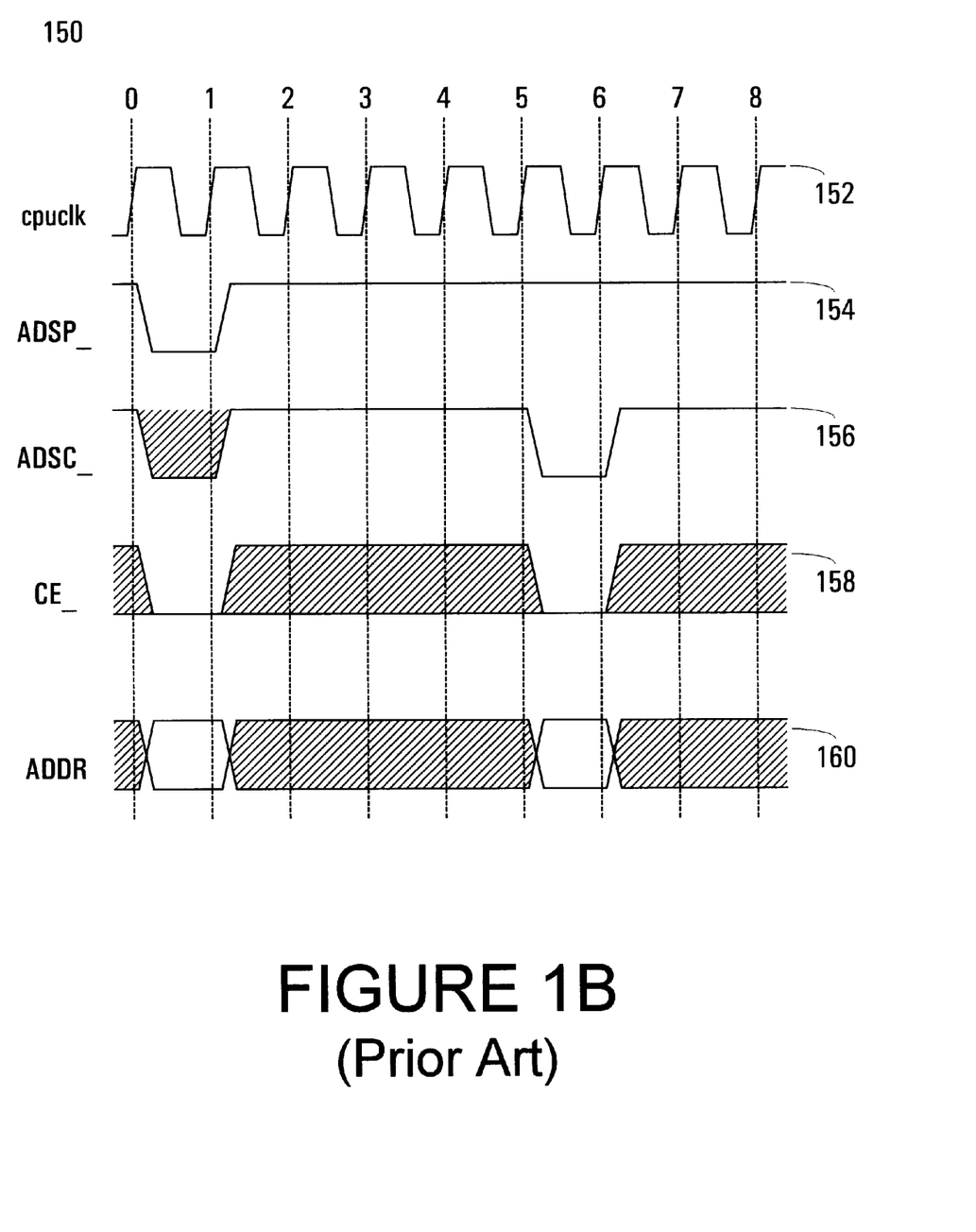
FIG. 1B illustrates a timing diagram of the signals used in latching an address in the prior art cache system of FIG. 1A.

Prior Art FIG. 1B illustrates a timing diagram 150 of the signals in the caching system for latching an address. A system clock provides a reference clock signal cpuclk 152 to synchronize the control signals in latching the address. The timing diagram 150 shows reference clock cycles, from 0 to 8. The SRAM 104 latches a new address on the rising edge of the system clock when the chip enable signal is sampled active low and either of the address status signals ADSP__ or ADSC__ is sampled active low. For example, as indicated by timing diagram 160, the SRAM 104 latches a new address at beginning of the clock cycle 1 when both address status signals ADSP__ and ADSC__ are active low and when the chip enable signal CE__ is active low. On the other hand, the SRAM 104 latches a new address at the beginning of clock cycle 6 as the address status signal ADSC__ and, chip enable signal CE__ are active low. The control circuit 106 activates the address status signal ADSC__ for accessing the main memory 208 for read/write (i.e., load/store) operations.

Unfortunately, the address latching mechanism illustrated in FIGS. 1A and 1B presents several drawbacks. First, wiring the address status signal ADS__ from the processor 102 to the SRAM 104 leads to narrower time margins for the control circuit 106 chip sets. This is because the address status signal ADS__ from the processor 102 is usually a time critical signal. Second, having an extra address status signal ADSP__ that can start a latching cycle in the SRAM leads to more complex controller circuit 106 circuitry. In addition, driving two control signals, the address status signal ADSC__ and CE__, from the controller 106 to the SRAM further complicates the design of the controller 106 circuitry.

Thus, what is needed is a method and system for latching an address into a SRAM without driving an address status signal from the processor to the SRAM. What is further needed is a method and system that can latch the address into the SRAM without driving two control signals. The present invention satisfies these needs by providing control circuitry that drives only one control signal into the SRAM while inactivating the address status signal ADSP__ on the SRAM.

DISCLOSURE OF THE INVENTION

The present invention is directed to a method and system for latching an address for accessing synchronous static random access memory (SRAM). In the latching method of the present invention, a first address status signal is driven active into the SRAM. The active signal of the first address status signal is used to trigger the SRAM to latch the address on the bus. A second address status signal is received when a valid address is placed on a bus coupled to the SRAM. In response, the first address status signal is driven inactive. This forces the last latched address by the SRAM to be the one indicated by the second address status signal. Then, a determination is made as to whether the SRAM access is required based on the address placed on the bus. The SRAM access may not be required if the current cycle is either non-cacheable or a miss in SRAM. When the SRAM access is not required, the first address status signal is driven active. In the alternative, when SRAM access is required, the first address status signal is maintained at an inactive state. The first address status signal is maintained inactive until the SRAM is ready to accept a second address.

The address latching system of the present invention comprises an bus, a control circuit, a processor, and an SRAM circuit. The bus is used to transmit address, data, and control signals. The control circuit is coupled to the bus for generating a first address status signal to latch the address. The control circuit drives the first address stats signal active to trigger latching of the address and drives the first address status signal inactive to stop latching of the address. The default state of the first address status signal is active to enable latching of the address until the control circuit drives the first address signal inactive. The processor is coupled to the bus for generating a second address status signal. The second address signal drives the first address status signal inactive. The SRAM circuit is coupled to the bus to receive the address and the first address status signal. The SRAM circuit is adapted to latch the address on the bus when the first address status signal is active and to stop latching the address when the first address status signal is inactive.

The present invention thus latches an address by driving only one control signal into a SRAM. By using only one control signal to trigger the latching of an address, the present invention allows the design of a simpler control circuit. Moreover, since a processor no longer drives a control signal into the SRAM, the present invention provides for wider time margins for the control circuit chip sets.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

In the following detailed description of the present invention, a method and system for latching an address into SRAM, numerous specific details are set forth in order to provide a thorough understanding of the present invention. However, it will be obvious to one skilled in the art that the present invention may be practiced without these specific details. In other instances, well known methods, procedures, components, and circuits have not been described in detail so as not to unnecessarily obscure aspects of the present invention.

Figure 2:
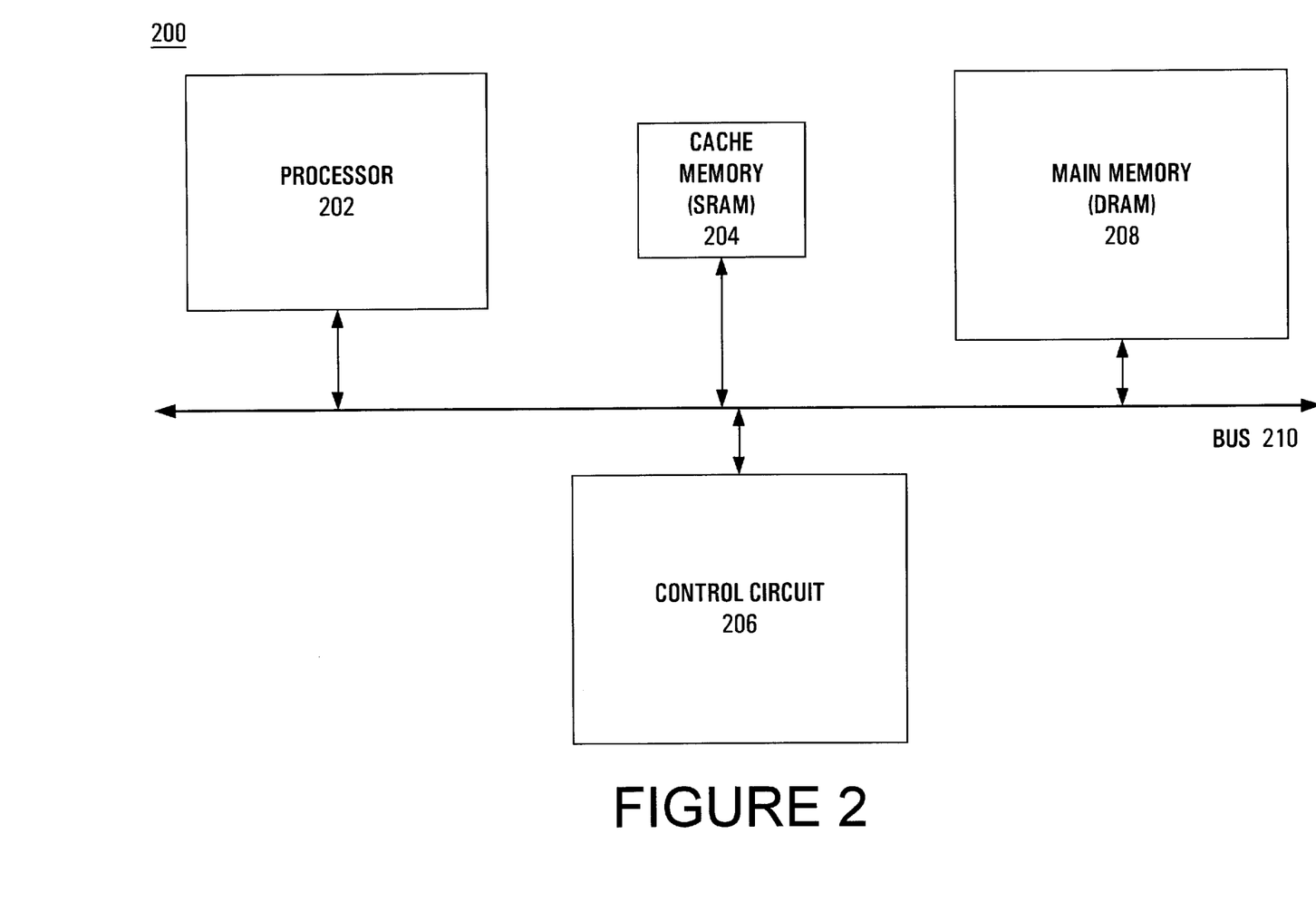
FIG. 2 illustrates a block diagram of an exemplary computer system including a cache system.

FIG. 2 illustrates a block diagram of an exemplary computer system 200 including a cache memory 204. The computer system 200 comprises a processor 202, a cache memory 204 (e.g., SRAM), a control circuit 206, a main memory 208 (e.g., DRAM), and a bus 210. The processor 202, the cache memory 204, the control circuit 206, and the main memory 208 are coupled to the bus 210. The processor 202 accesses data in the main memory 208 by reading the data from and/or writing the data to the main memory 208, and may also access data in the cache memory 204. The small high-speed cache memory 204 stores the most frequently addressed data. The control circuit 206 is commonly known as a cache controller and controls all cache operations among the processor 202, the cache memory 204, and the main memory 208. For example, the control circuit 206 can implement well known caching schemes such as data placement schemes, data replacement schemes, and read/write schemes upon cache hits and misses.

Figure 3:
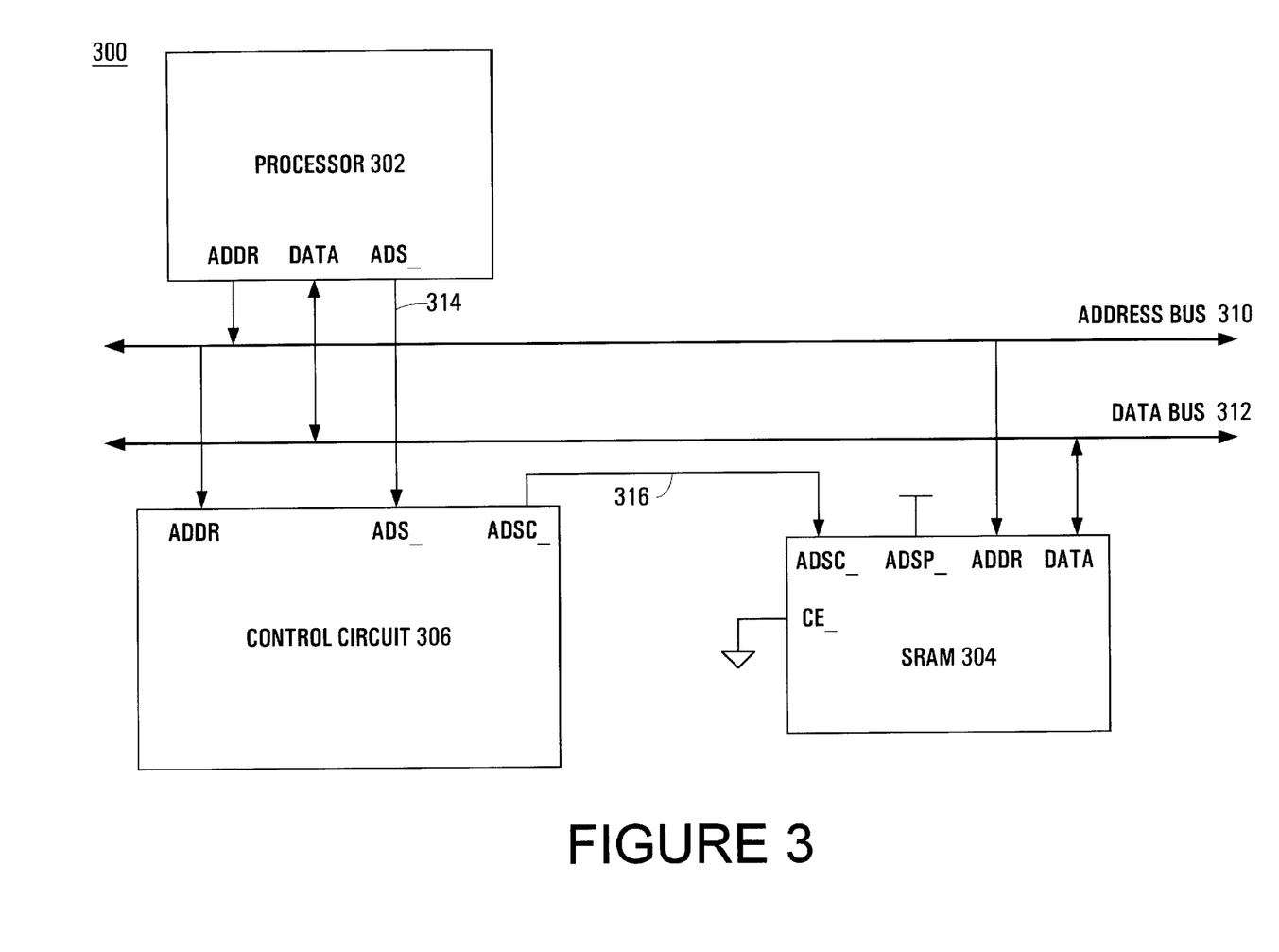
FIG. 3 illustrates a block diagram of a caching system in accordance with the present invention.

FIG. 3 illustrates a block diagram of a cache system 300 in accordance with the present invention. FIG. 3 depicts how an SRAM 304 latches an address in response to a single control signal ADSC__ from the control circuit 306. The cache system 300 includes a processor 302, an SRAM 304 implementing a cache memory, a control circuit 306, and a bus comprising an address bus 310, a data bus 312, and a control bus.

The SRAM 304 receives only one address status signal, ADSC__. The former address status signal from the processor is coupled to an inactive state. On the other hand, the chip enable signal CE__ is enabled (i.e., active) at all times by coupling it to an active state. The SRAM is coupled to address bus 310 and data bus 312 to receive address and data on respective buses. In one embodiment of the present invention, the SRAM 304 includes a memory cell array for storing data and other circuitry for interfacing the memory cell array with the external circuits and peripherals. It should be appreciated that a computer system of the present invention may include a plurality of cache levels. For example, a computer system can have two levels of cache, level one (L1) and level two (L2), between a processor and a main memory. The level one cache, L1, is the fastest and smallest and operates between the processor and L2 cache. The level two cache, L2, is typically slower but larger than the L1 cache, and operates between the L1 cache and the main memory.

To access data, the processor 302 issues an address of the data to be accessed on the address bus 310 and sends out an address status signal ADS__ to the control circuit 306 through a control bus line 314. When active, the address status signal ADS__ on the control bus line 314 signals to the control circuit 306 that the address on the address bus is valid and can be latched.

In the present invention, the control circuit 306 activates an address status signal ADSC__ to signal the SRAM 304 to latch the address on the address bus 310. Initially, the control circuit 306 sets the address status signal ADSC__ to active state, which is the default state in accordance with the present invention. Hence, the default active state of the address status signal ADSC_ allows the SRAM 304 to latch the address on the address bus on every clock.

Upon receiving an active address status signal ADS_ from the processor 302, the control circuit 306 determines whether the SRAM 304 access is required based on the address placed on the address bus 310. As is well known in the art, the SRAM 304 need not be accessed if the current cycle is either non-cacheable or is a miss in the SRAM. When the SRAM 304 need not be accessed, the control circuit 306 drives the first address status signal ADSC_ to the SRAM 304 active. In the alternative, when the SRAM 304 access is needed, the control circuit 306 drives the first address status signal ADSC_ to the SRAM 304 inactive. The first address status signal ADSC_ is maintained inactive until the SRAM 304 is ready to accept another address.

Latching the address on every clock while the address status signal ADSC_ is active thus ensures that the last address latched by the SRAM is that of the valid processor clock cycle. Once the address status signal ADSC_ is triggered inactive, the control circuit keeps the address status signal ADSC_ in the inactive state until the SRAM 304 is ready to accept another cycle. In the meantime, the processor 302 can place a new address on the address bus 310. When the SRAM 304 is ready to accept another address, the control circuit 306 activates the address status signal ADSC_. This enables the SRAM 304 to latch the new address on the address bus. In one embodiment of the present invention, the SRAM 304 includes an address register coupled to the address bus 310 for latching an address.

Figure 4:
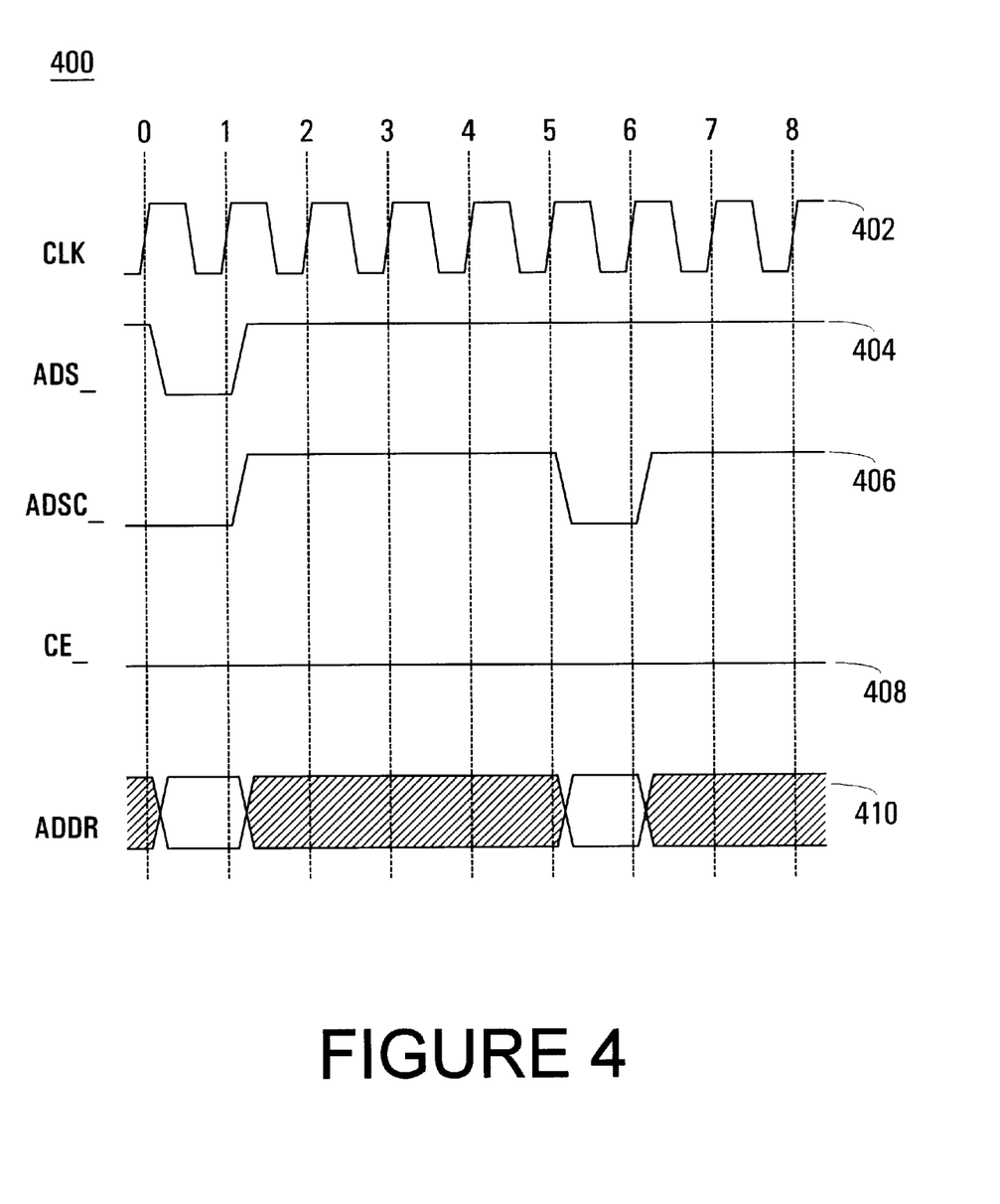
FIG. 4 illustrates a timing diagram of the signals used in the caching system in latching an address in accordance with the present invention.

FIG. 4 illustrates a timing diagram of the caching system for latching an address in accordance with the present invention. A system clock provides a reference clock signal clk 402 to synchronize the control signals in latching the address. The timing diagram 400 shows reference clock cycles, from 0 to 8. The chip enable signal 408 for the SRAM 304 is active at all times. Initially, the address status signal ADSC_ 406 from the control circuit 306 is in the active low state, which is the default state. During the default state, the SRAM 304 latches an address on the address bus 310 on every valid clock cycle as indicated by ADDR signal 410.

With reference to FIG. 4, the address status signal ADS_ 404 from the processor 302 changes from inactive high to active low at the start of the clock cycle 0. The now active address status signal ADS_ 404 drives the address status signal ADSC_ 406 inactive at the start of clock cycle 1. At the same time, the SRAM 304 or its address register latches the address on the address bus at the start of the clock cycle 1. The control circuit 306 maintains the address status signal ADSC_ 406 in the inactive state until the SRAM 304 is ready to accept another address. This occurs at the beginning of clock cycle 5 where the control circuit drives the address status signal ADSC_ 406 active low for one clock period. Since the address status signal ADS_ 404 from the processor 302 remains inactive high during this time, the active low state of the address status signal ADSC_ 406 indicates access to the main memory for read/write operations. In response, the SRAM latches a new address on the address bus 310 at the start of the clock cycle 6. The control circuit 306 then keeps the address status signal ADSC_ 406 in the inactive high state until the SRAM is ready to accept another address.

Figure 5:
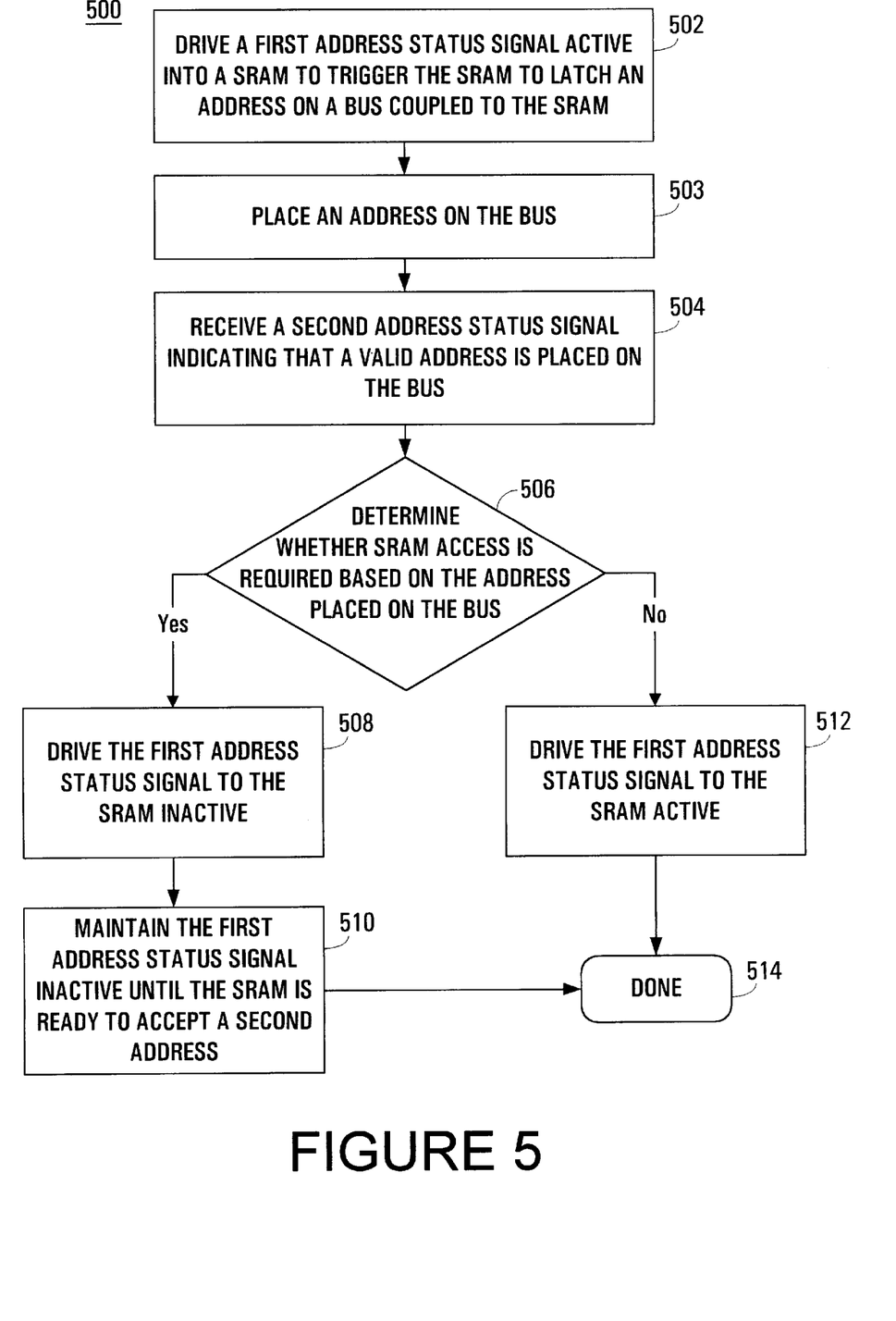
FIG. 5 illustrates a flow chart of the steps involved in latching an address on the address bus into a cache SRAM.

FIG. 5 illustrates a flow chart 500 of the steps involved in latching an address on the address bus into the cache, SRAM 304. It should be appreciated that the SRAM 304 is activated at all times during the process by enabling the chip enable signal CE_ for the SRAM. In step 502, a first address status signal is driven active, triggering the SRAM 304 to latch an address on a bus coupled to the SRAM 304. Next in step 503, an address to be latched is placed on the bus. Then in step 504, the cache controller of the present invention receives a second address status signal indicating that a valid address is placed on the bus. Next in step 506, a determination is made as to whether SRAM access is required based on the address placed on the bus. As is well known in the art, the SRAM 304 need not be accessed if the current cycle is either non-cacheable or a cache miss occurs. If SRAM access is required, the first address status signal to the SRAM 304 is driven inactive in step 508. The first address status signal is maintained inactive until the SRAM 304 is ready to accept a second address in step 510. In the alternative, if SRAM access is not required, the first address status signal to the SRAM 304 is driven active in step 514. This is the default status for the first address status signal. The process 500 then terminates in step 514.

The present invention thus uses one control signal line between the control circuit 306 and the SRAM 304 to latch an address. Since the SRAM 304 latches an address on every clock that it samples the first address status signal active, this ensures that the last address latched by the SRAM 304 is that of a valid clock cycle. Thus, the present invention allows the design of a simpler control circuit. Moreover, since a processor no longer drives a control signal into the SRAM, the present invention provides for wider time margins for the control circuit chip sets.

The present invention, a method and system for latching an address into SRAM, is thus described. While the present invention has been described in particular embodiments, it should be appreciated that the present invention should not be construed as being limited by such embodiments, but rather construed according to the claims below.

What is claimed is:

1. In a computer system, a method for latching an address for accessing data in a synchronous static random access memory (SRAM), comprising the steps of:

(a) driving a first address status signal active to trigger the SRAM to latch an address on a bus coupled to the SRAM;

(b) placing an address on the bus;

(c) receiving a second address status signal indicating that a first address that is placed on the bus is valid;

(d) determining whether the SRAM needs to be accessed based on the address placed on the bus;

if the SRAM needs to be accessed, (e) driving the first address status signal inactive; and (f) maintaining the first address status signal inactive until the SRAM is ready to accept a second address; and if the SRAM does not need to be accessed, (g) driving the first address status signal active.

2. The method as recited in claim 1 further comprising the step of:

(h) repeating said steps from (a) through (g).

3. The method as recited in claim 1 wherein said SRAM latches an address at the beginning of a first valid clock cycle after said first address status signal becomes active.

4. The method as recited in claim 1 wherein said second address status signal drives said first address status signal inactive at the beginning of a first valid clock cycle after said second address status signal becomes active.

5. The method as recited in claim 1 wherein said SRAM latches an address on every clock cycle when said first address status signal is active.

6. The method as recited in claim 1 further comprising, before said step (a), the step of enabling said SRAM at all times.

7. The method as recited in claim 6 wherein said SRAM is enabled by driving a chip enable signal CE_ into said SRAM.

8. An address latching system for loading an address into a synchronous static random access memory (SRAM), said address latching system comprising:

a bus;

a control circuit coupled to said bus for generating a first address status signal to trigger said SRAM to latch said address, said control circuit for driving said first address status signal active to enable latching of said address when said SRAM need not be accessed based on said address and for driving said first address status signal inactive to stop latching said address when said SRAM access is needed until the SRAM is ready to accept another address;

a processor coupled to said bus for generating a second address status signal which drives said first address status signal to become inactive;

wherein said SRAM is coupled to said bus to receive said address and said first address status signal, said SRAM circuit adapted to latch said address when said first address status signal is active and to stop latching said address when said first address status signal is inactive.

9. The system as recited in claim 8 wherein said SRAM circuit latches said address at the beginning of a first valid clock cycle after said first address status signal becomes active.

10. The system as recited in claim 8 wherein, in response to said second address status signal, the control circuit drives said first address status signal inactive at the beginning of a first valid clock cycle after said second address status signal becomes active.

11. The system as recited in claim 8 wherein said SRAM circuit latches said address on every clock cycle when said first address status signal is active.

12. The system as recited in claim 8 wherein said first address status signal is ADSC_.

13. The system as recited in claim 8 wherein said second address status signal is ADS_.

14. The system as recited in claim 8 wherein said SRAM circuit includes an address register which latches the address.

15. The system as recited in claim 14 wherein said SRAM circuit is enabled at all times.

16. The system as recited in claim 15 wherein said SRAM circuit is enabled by driving a chip enable signal CE_ into said SRAM circuit.

\* \* \* \* \*